United States Patent [19]

Wagner et al.

[11] 4,002,381
[45] Jan. 11, 1977

[54] CARD MOUNTING ASSEMBLY

[75] Inventors: Guy Robert Wagner, Arvada; David Allan Weisheit, Broomfield, both of Colo.

[73] Assignee: Bell Telephone Laboratories, Incorporated, Murray Hill, N.J.

[22] Filed: July 31, 1975

[21] Appl. No.: 600,595

[52] U.S. Cl. .............................. 312/183; 312/185; 312/320; 211/41; 339/17 R
[51] Int. Cl.[2] ........................................ A47B 63/00
[58] Field of Search .......... 312/184, 185, 319, 320; 339/17, 75; 211/41

[56] References Cited

UNITED STATES PATENTS

| | | | |
|---|---|---|---|
| 2,609,268 | 9/1952 | Nye ..................... | 312/320 |
| 3,140,905 | 7/1964 | Trotter et al. ................ | 312/320 |
| 3,184,069 | 5/1965 | Rosenberg ................ | 211/41 |
| 3,216,580 | 11/1965 | Fricker, Jr. ................ | 211/41 |
| 3,476,258 | 11/1969 | Dorsett ................ | 312/320 |
| 3,575,482 | 4/1971 | MacMaster et al. ............ | 312/320 |
| 3,714,513 | 1/1973 | Marconi ................ | 211/41 |
| 3,838,777 | 10/1974 | Thornicroft et al. ................ | 211/41 |
| 3,878,438 | 4/1975 | Weisman ................ | 211/41 |
| 3,899,721 | 8/1975 | Borchard et al. ................ | 211/41 |
| 3,912,353 | 10/1975 | Kasuya et al. ................ | 211/41 |

*Primary Examiner*—Paul R. Gilliam
*Assistant Examiner*—Victor N. Sakran
*Attorney, Agent, or Firm*—J. S. Cubert

[57] ABSTRACT

A component card assembly includes a grooved guide adapted to interengage a component card edge between the card receiving and base ends of a support frame. The guide is fixedly attached to the frame base end and comprises an elastically elongatable section. A lever pivotally mounted on the card engages the guide at the frame card receiving end. The pivoting of the lever into a locked position on the frame elastically elongates the guide whereby the component card is controllably restrained in a home position on the frame.

11 Claims, 6 Drawing Figures

CARD MOUNTING ASSEMBLY

BACKGROUND OF THE INVENTION

Our invention relates to electronic module structures and, more particularly, to mounting arrangements for electronic component cards.

In modern electronic equipment, a component assembly generally comprises a plurality of printed circuit cards each including interconnected electronic components. The cards are individually inserted into preselected positions in a support frame, which frame provides interconnections between the cards and other devices external to the assembly. Each card includes an extension portion at one end thereof adapted to fit into and electrically interconnect with a mating connector in the support frame. In this manner, the required connections between module components are obtained. The card mounting arrangements restrain the card into position in the support frame and assure reliable contact between the card and its mating connector under conditions expected in operation.

Variations in card dimensions, occurring during normal manufacture create problems in assuring the required degree of contact reliability and card restraint in the support frame. In particular, variations in card length may result in unreliable card connections or interference fits with the mating connector of the support frame. Where a fixed card restraining arrangement is used, smaller dimensioned cards may be loose and vibrate and provide unreliable connections to the mating frame connector. Large dimensioned cards may result in interference fits with the mating frame connectors with the risk of damage to the card, the mating connector, or the connector mounting. Current miniaturization techniques used to reduce the size and increase the speed of operation of electronic equipment result in a scaling down of the mechanical structure of cards, the wiring and connection arrangements, and the support frame. The scaled-down interconnection parts, however, are subject to greater risk of damage.

Component card arrangements have utilized separately mounted spring loaded mechanisms to accommodate interference fits between component cards and their mating connectors. These mechanisms, in general, are complex, bulky, external to the support frame structure, and result in increased size of the equipment module, contrary to the requirements of miniaturized design. The spring loading mechanisms also require special insertion and removal procedures. It is an object of the invention to provide an economical, small-size, easily operated component card mounting mechanism incorporated within the card support frame assembly and adapted to elastically restrain a card in the frame.

SUMMARY OF THE INVENTION

The invention is directed to a mounting arrangement in a component assembly adapted to restrain a component card into a home position in its support frame and the mating connector at the base end thereof. At least one card guide fixedly attached to the support frame base end engages the card between the frame receiving end and the frame base end. The guide includes an intermediate elastic portion between the frame connector end and the frame card receiving end. A lever pivotally mounted on the card engages the guide at the card receiving end of the support frame. The pivoting of the lever toward the frame urges the card against the connector end of the support frame and elongates the elastic portion of the guide to provide restraint in accordance with the relative dimensions of the card and the support frame.

According to one aspect of the invention, the guide includes an elongated groove for interengaging an edge of the card end; and the lever pivotally mounted on the card includes a first shaped end adapted to engage the grooved card guide at the support frame card receiving end. A second shaped end of the lever on the other side of the pivot mounting locks into engagement with a slotted extension of the card. With the lever in its locked position on the card, the card is restrained into its connected position on the frame responsive to a controlled force generated by the elongation of the elastic portion of the slotted guide.

According to another aspect of the invention, the connector end of the support frame includes a support member transverse to the direction of motion of the card and juxtaposed with the slotted guide. A projection member of the slotted guide is fitted into a hollow portion of the frame connector end support member to fixedly attach the slotted guide to the connector and support frame member.

According to another aspect of the invention, the slotted guide is in slidable engagement with a second fixed support frame member at the support frame card receiving end whereby the slotted guide is restrained from deflecting away from its longitudinal axis upon pivotal movement of the card lever.

According to yet another aspect of the invention, a component card assembly includes at least one component card, a support frame and a pair of spaced elongated guide members connected between the receiving end and base end members of support frame. Each guide member has a longitudinal groove for interengaging one edge of the card, the card being slidably movable between said receiving end and base end members. One guide member is fixedly attached to the base end member and has an elastically elongatable section adapted to stretch responsive to the pivoting of a card mounted pivoting lever to restrain the card against the frame base end. The other guide member is fixedly attached to the base end member and includes an elastically deformable section adapted to laterally restrain the card edge interengaged therewith.

DETAILED DESCRIPTION OF THE INVENTION

Figure 1:
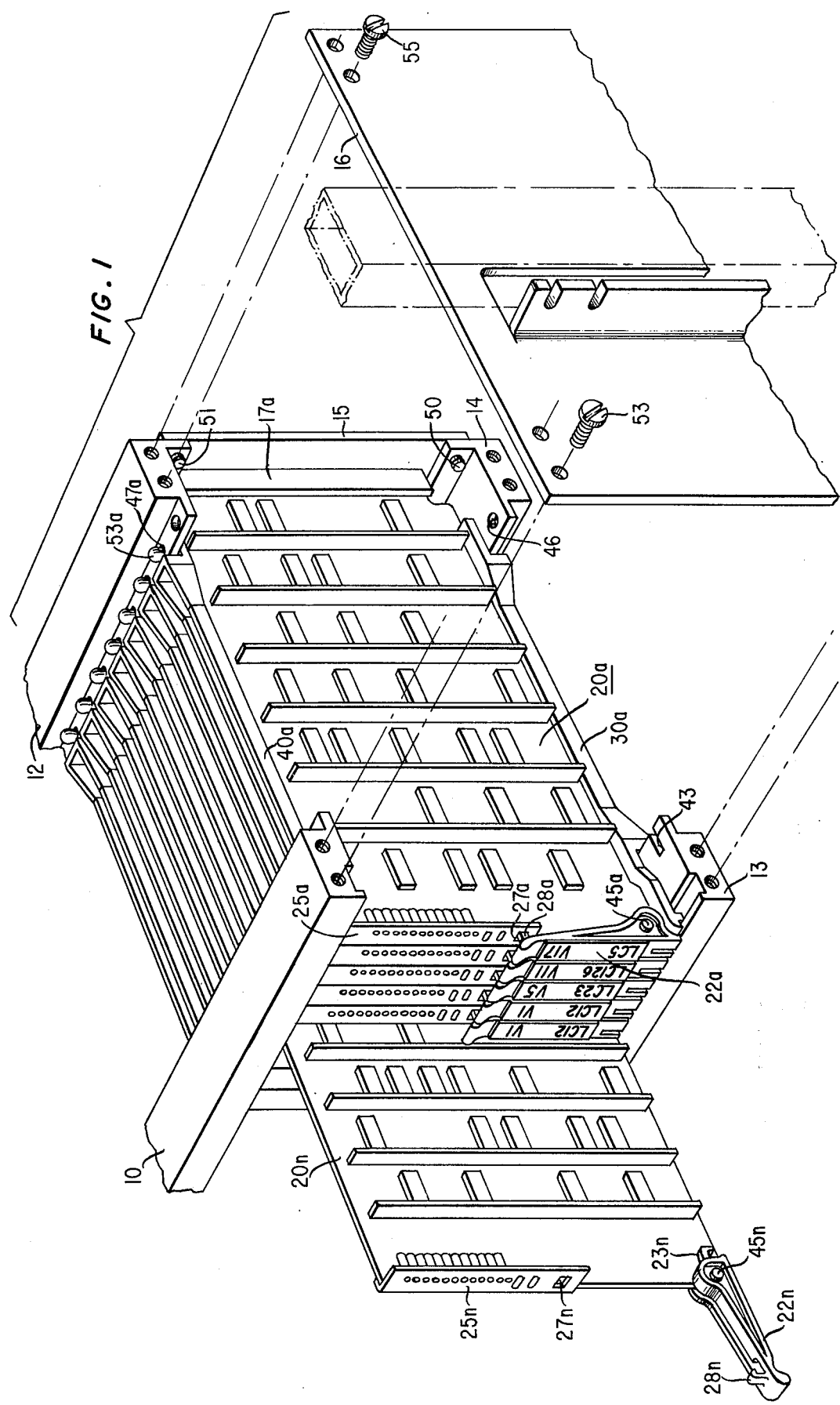
FIG. 1 depicts a perspective view of a component card assembly illustrative of the invention.

Referring to FIG. 1, a plurality of component cards, including cards 20a and 20n, are shown in a support frame comprising card receiving end cross-members 10 and 13 and connector end cross-members 12 and 14. Connector 17a, into which one end of component board 20a is inserted, is fixedly held on frame vertical member 15 which spans between cross-members 12 and 14 and is attached to said cross-members by a fastening arrangement including bolts 50 and 51. Support frame right side member 16 is bolted onto the end cross-members 10, 12, 13, and 14 by means of bolts 53, 55, and others not shown. Similarly, another side member (not shown) is bolted onto the other ends of cross-members 10, 12, 13, and 14 on the left side of the support frame assembly.

Each component card is slidably guided into its home position against the connector end of the support frame by spaced parallel upper and lower slotted guides. Card 20a is slidably guided between upper slotted guide 40a and lower slotted guide 30a. These slotted guides are fitted into position on the cross-members of the frame so that the card assigned to that position in the frame is guided to its home position into its mating connector. A lever is pivotally mounted on the lower left portion of each card. The lever is at the card receiving end of the frame above cross-member 13 when the card is inserted into the frame. Lever 22n, shown in a horizontal position on partially inserted card 20n, is pivotally mounted on pin 45n and pivots about said pin from said horizontal position to a vertical position in which hook 28n of the lever engages into and is locked into position in slot 27n of card lateral extension 25n. Card 20a is shown in its fully engaged position in the support frame. Lever 22a, pivotally mounted on pivot pin 45a, is in its vertical position, with hook 28a locked into position into slot 27a of card faceplate 25a.

Figure 2:
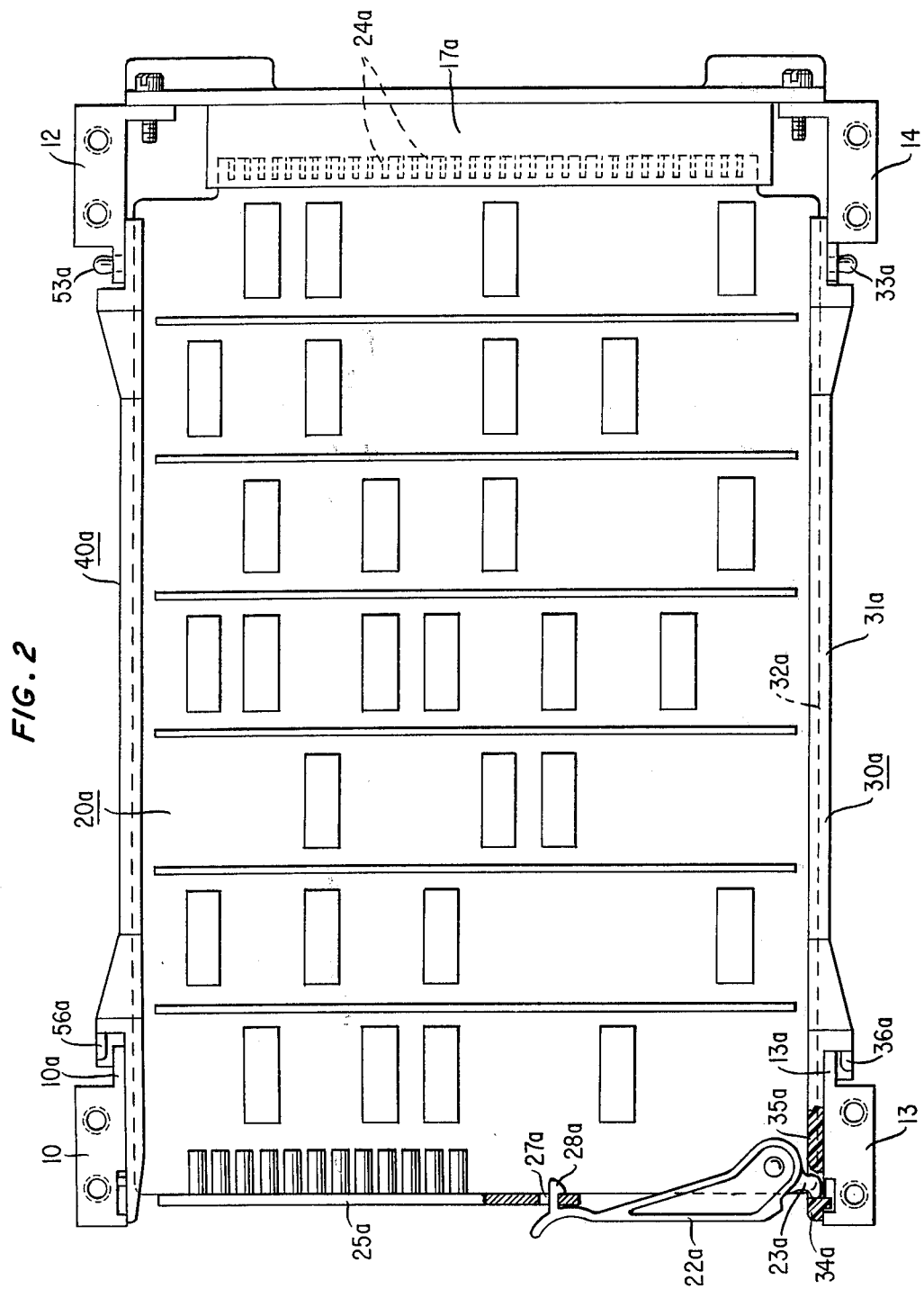
FIG. 2 shows a side view of a component card in a support frame and the guiding arrangements therefor illustrative of the invention.

The mounting arrangements for slotted guides 30a and 40a are shown in FIG. 2. Guide 30a comprises grooved section 32a into which the lower edge of card 20a fits. Slotted section 32a forms a track in which the lower edge of card 20a slides. There is a similar groove on guide 40a into which the upper edge of card 20a fits. Guide 30a comprises an expandable projection 33a at the frame base end which is forced into a hole adjacent to hole 46 of FIG. 1 in connector end cross-member 14. A similar expandable projection or detent on upper guide 40a is fitted into hole 47a in cross-member 12 of FIG. 1. In this manner, one end of slotted guide 30a is fixedly connected to connector end cross-member 14, while one end of guide 40a is similarly connected to connector end cross-member 12.

At the card receiving end of the support frame, a rectangular portion of slotted guide 30a fits into a slot (not shown) adjacent and substantially identical to slot 43 shown in FIG. 1. Section 35a of guide 30a rests on cross-member 13 and projection 36a of guide 30a underlies portion 13a of cross-member 13 so that the receiving end of the slotted guide is horizontally slidable. Projection 36a prevents vertical movement of guide 30a. Upper guide 40a is similarly attached to cross-member 10 at the frame card receiving end.

Section 31a of guide 30a, intermediate the connector and card receiving ends of the support frame, comprises an elastic material which stretches responsive to the clockwise pivotal motion of lever 22a. Lever 22a includes hooked end 23a adapted to fit into rectangular slot 39a between portions 34a and 35a of guide 30a. Clockwise pivotal motion of lever 22a transmits a longitudinal force to card 20a via pivot 45a that urges card 20a into connector 17a. The pivotal motion also exerts a longitudinal force in the opposite direction on guide 30a due to the engagement of hook 23a with end 34a of the guide.

The longitudinal force on guide 30a elongates elastic section 31a. When lever 22a is locked into slot 27a of card 20a, the elongated section 31a exerts a force through pivot 45a, which force restrains card 20a in connector 17a. The stretching of section 31a accommodates any interference fits between end 23a of card 20a and connector 17a. Advantageously, the stretching action of guide 30a responsive to the pivoting of lever 22a controls the force of the card against the connector so that the card is restrained and no damage occurs in the event of an interference fit.

Figure 3:
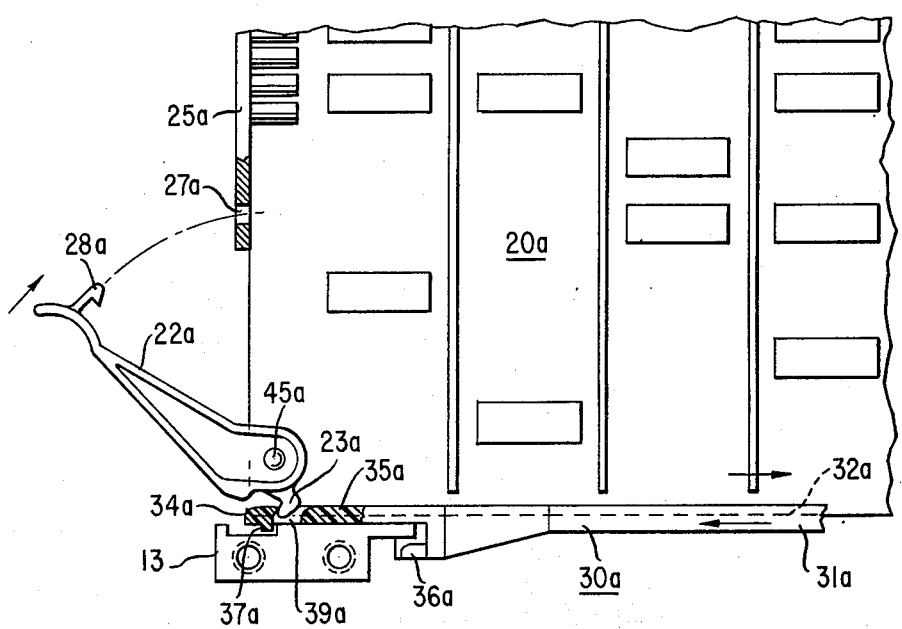
FIG. 3 shows a side view of a portion of a component card during insertion into a support frame in accordance with the invention.

FIG. 3 shows the lower left portion of card 20a including lever 22a, pivot 45a, and the adjacent portion of guide 30a with a portion of elastic section 31a and receiving end cross-member 13. Lever 22a is shown in an intermediate position wherein hooked end 23a engages a wall of slot 39a during the insertion of card 20a into the support frame connector. As indicated, card 20a is slidably guided to the right against connector 17a (not shown). Elastic section 31a is stretched to the left due to the force of hook 23a against end 34a. Projection 36a prevents the receiving end of the slotted guide from being vertically lifted by lever 22a.

Card 20a is urged against connector 17a responsive to the indicated clockwise pivotal motion of lever 22a. When end 28a of lever 22a is hooked into slot 27a on the card, as in FIG. 2, the elongated guide generates a force directing card 20a into connector 17a. It is readily seen that the force obtained from the elongation of elastic section 31a is variable and a function of the card, support frame, and connector dimensions. In application, the length of guide 30a is selected so that the minimum length card inserted into the support frame is sufficiently restrained to avoid unreliable connections. The stretching of elastic section 31 is selected so that the longest card to be used in the support frame is subject to limited restraint to avoid excessive stress on the connector or the card.

A side view of upper guide 40a is shown in FIG. 2. The upper guide is fixedly attached to cross-member 12 by means of detent 53, which detent expands after its insertion into hole 47a. The position of guide 40a in the support frame is determined by the slot in upper cross-member 10 into which the card receiving end of guide 40a is inserted. The slots in member 10 are arranged so that the upper guides are in parallel, spaced relationship and aligned with the parallel, spaced lower guides. Projection 56a of guide 40a rests on portion 10a of cross-member 10 to vertically position guide 40a. The section of guide 40a intermediate the receiving and base ends is elastic.

Figure 6:
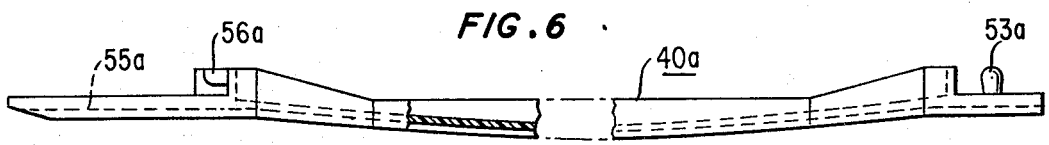
FIG. 6 shows a side view of the other guide of FIGS. 1 through 3 in accordance with the invention.

As shown in FIG. 6, the elastic section of guide 40a is normally bowed toward the support frame lower guide. After insertion of card 20a into the support frame as shown in FIG. 2, the upper edge of card 20a bears upwardly on the bowed portion of guide 40a. The intermediate elastic section of guide 40a is deflected upward and guide 40a provides a downward restraining force against the upper edge of card 20a. The upward movement of the card is restrained to elastically accommodate the expected variations of card width.

Figure 4:
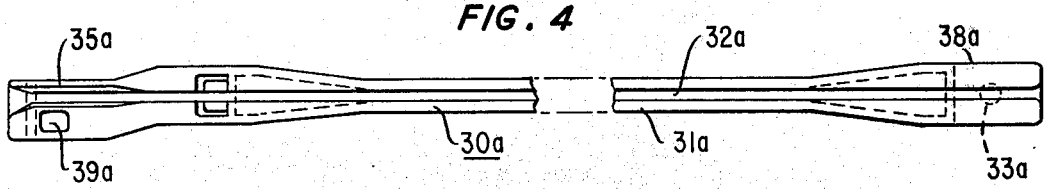
FIG. 4 shows a top view of the one slotted guide of FIGS. 1 through 3 in accordance with the invention.
Figure 5:
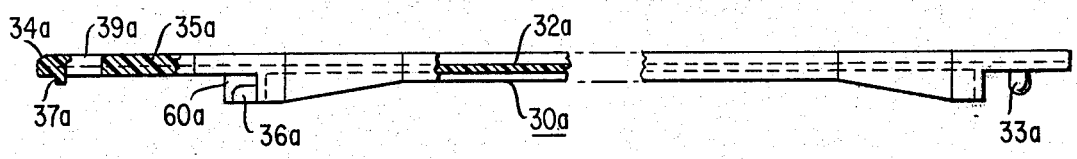
FIG. 5 shows a side view of the one slotted guide of FIGS. 1 through 3 in accordance with the invention.

FIGS. 4 and 5 show top and side views of lower guide 30a. Intermediate portion 31a has an H-shaped cross section dimensioned to provide the required longitudinal force upon elongation. End sections 38a and 35a are relatively massive compared to elastic section 31a so that the longitudinal force generated by the stretching of section 31a is unaffected by the end sections. Elongated groove 32a runs the entire length of guide 30a and is widened at end 35a to permit easy insertion of the connector end of component card 20a. Offset rectangular slot 39a, located at the card receiving end of guide 30a adjacent to and in alignment with lever 22a, is adapted to engage hook 23a just prior to the entry of card connector end 24a into connector 17a. The leftmost wall of slot 39a engages hook 23a during the clockwise pivoting of the lever. Rectangular section 60a is adapted to fit into a slot in cross-member 13 to fixedly position guide 30a in spaced, parallel relation with the other lower guides and in alignment with upper guide 40a. Offset projection 36a restrains guide 30a from vertical movement. In this way, the card receiving end of guide 30a is slidably mounted on cross-member 13.

In operation, the connector end of card 20a is positioned between the slots of upper and lower guides 40a and 30a at the card receiving end of the support frame. The upper and lower edges of the card are then interengaged with the slotted guides. Card 20a is slidably guided toward the base end cross-members by guides 40a and 30a until connector extension 24a of the card touches connector 17a. At this point, hooked end 23a of card-mounted lever 22a is adjacent slot 39a of the lower guide while lever 22a is in a horizontal position. The lever is pivoted clockwise so that the connector extension of card 20a is urged into the open end of connector 17a. The engagement of hook 23a with the left wall of slot 39a allows the elongation of guide 30a while card 20a is forced into connector 17a. When lever 22a reaches its vertical position, the connector end of card 20a is fully inserted into connector 17a and hook 28a is locked into rectangular slot 27a. Elongated guide 30a then transmits a card restraining force via lever 22a and pin 45a to maintain card 20a in its home position.

With the card fully inserted, upper guide 40a is fixed at the frame connector end by detent 53a and is restricted at the card receiving end by rectangular section 56a of guide 40a and cross-member 10. The elastic intermediate section of guide 40a applies a force downward on he upper edge of card 20a to restrain vertical movement of the card. The elastic deformation of upper guide 40a accommodates the variations in card width.

Advantageously, the use of lever 22a provides a controlled card insertion force, and elastic guide 30a provides card restraint in accordance with the dimensional tolerances of the card, the support frame, and the mating connector. In the event that the card cannot be fully inserted into the connector, lever 22a is prevented from locking into its vertical position, thereby giving an indication of card misalignment.

The upper and lower guides may be made from a plastic composition, such as 10 percent glass-filled polycarbonate. As is well known in the art, this material is formed by injection molding and exhibits elastic properties adapted to provide the elastically elongatable slotted guide and the elastically deformed guide of the invention. It is to be understood, however, that other suitable compositions can also be used. Each guide is injection molded to form the slotted guide structure shown in FIGS. 4 through 6. The H cross section of the intermediate elastic portion of the guide is readily molded and provides the slotted section that slidably interengages the component card edge.

Both the connector and card receiving end sections of the guide are relatively massive compared to the intermediate section and these sections elongate very slightly compared to the intermediate section responsive to the pivotal movement of the lever. The pivotally mounted lever may comprise an injection moldable polycarbonate composition or other material having suitable stiffness to pivotally urge the component card into its home position on the support frame and to transmit the card-restraining force from the elongated lower guide to the card without deformation.

Although the invention has been described with reference to specific embodiments thereof, it is to be understood that these embodiments are illustrative only and modifications and variations apparant to those skilled in the art may be made without departing from the spirit and scope of the invention.

What is claimed is:

1. A component assembly comprising at least one component card, a frame for supporting said component card including a card receiving end member, a base end member, a guide member for slidably guiding said card between said card receiving end and base end members, a lever pivotally mounted on said card for engaging said guide member at said receiving end member, said lever being adapted to lock into a fixed position on said card when said card is in a home position against said card receiving end member, said guide member being fixedly attached to said base end member and slidably attached to said receiving end member, said guide member having an elastically elongatable section intermediate said receiving end member and base end member, said elastically elongatable section of said guide member being longitudinally elongated responsive to the pivoting of said lever towards said card, said guide member and said lever cooperating to urge said card against said base end member and to controllably restrain said card in said home position against said base end member.

2. A component assembly according to claim 1 wherein said guide member includes an elongated groove for slidably engaging an edge of said card between said receiving end and base end members, a first end section fixedly attached to said base end member, a second end section slidably mounted on said card receiving end member, and a longitudinally elastically elongatable section intermediate said first and second end sections.

3. A component assembly according to claim 2 wherein said lever comprises a first hooked end, and said guide member comprises a slotted portion, said first hooked end being engageable with a wall of said slotted portion during pivoting of said lever to elongate said first guide member intermediate section.

4. A component assembly according to claim 3 wherein said lever further comprises a second hooked end, and said card comprises an extension member having a slotted section, said lever second hooked end being adapted to lock into said slotted card extension member to terminate the pivotal movement of said lever.

5. An electronic component module comprising at least one component card, a frame for supporting said component card including a base end member, a receiving end member, and a guide member between said receiving end and base end members, said guide member having a longitudinal groove for engaging an edge of said card, said card being slidably movable in said groove between said receiving end and base end members, said guide member comprising a first end section fixedly attached to said base end member, a second end section slidably mounted on said receiving end member, a lever pivotally mounted on said card including means for engaging said guide member second end section during movement of said card toward said base end, means for locking said lever into a predetermined position on said card for terminating said pivoting motion, wherein the improvement comprises said guide member includes an elastically elongatable section intermediate said first and second end sections which elastically elongatable section is longitudinally stretched responsive to the pivoting of said lever toward said card, said guide member with said longitudinally elongatable elastic section cooperating with said pivotable lever to controllably urge said card into a home position against said base end member and to controllably restrain said card in said home position.

6. An electronic component module according to claim 5 wherein the interengaging means on said lever comprises a first hook-shaped end adjacent to said guide member, said guide member second end section further comprising a slotted portion into which said lever first hook-shaped end inserts, said lever first hook-shaped end bearing on a wall of said slotted portion during the pivotal motion of said lever to longitudinally elastically elongate said guide.

7. An electronic component module according to claim 6 wherein said lever further comprises a second hook-shaped end and said lever locking means comprises a slotted extension of said card, said lever second hook-shaped end being pivoted into locked engagement with said slotted extension.

8. A component card assembly comprising at least one component card, a frame for supporting said card including a card receiving member, a base member, and an elongated guide member connected between said receiving end and base end members having a longitudinal groove for interengaging an edge of said card, said card being slidably movable in said guide member groove between said receiving end and base end members, said guide member comprising a first end section fixedly attached to said base end member, and a second end section slidably engaging said receiving end member, a lever pivotally mounted on said card having a first end on one side of said pivotal mounting adapted to engage the second end section of said guide member and a second end on the other side of said pivotal mounting, said card including a slotted extension for locking said lever second end into a fixed position on said card to terminate the pivoting of said lever, said guide member including a longitudinally elongatable section intermediate said first and second end sections, said guide member intermediate section being elastically elongated by the movement of said lever first end against said guide member second end section, said card being controllably urged toward and controllably restrained against said frame base member by said elastically elongated guide member.

9. An electronic module assembly comprising a plurality of component cards, a frame for supporting said plurality of cards in spaced, parallel relation, said frame including a base end member, a card receiving member, means interengaging the upper edge of each card for guiding said card upper edge, and means interengaging the lower edge of each card for guiding said lower card edge, said upper and lower edge guiding means being in spaced alignment and said card being slidably movable between said upper and lower edge guiding means, a lever pivotally mounted on each card, means on said lever for engaging the lower edge guiding means at said card receiving end member, means for fixedly attaching said lower guiding means to said base end member, and means for slidably mounting said lower guiding means on said card receiving end member, said lower edge guiding means comprising a portion elastically elongatable along its longitudinal axis, said elastically elongatable portion being elastically stretched in response to the pivotal movement of said lever toward said base end member, said card being controllably urged into a home position against said base end member by the cooperation of said lever and said elastically elongated guide member.

10. An electronic assembly comprising at least one component card, a frame for supporting said component card having a base end member including an electrical connector member and a card receiving end member, said component card comprising a pivotally mounted lever, a guide disposed between said card receiving and base end members having an elongated groove for slidably interengaging an edge of said component card, said guide comprising a first end section fixedly attachable to said base end member, a second end section slidably mountable on said card receiving end member, and an elongatable elastic section intermediate said first and second end sections, said second end section comprising means for interengaging said lever, said elastic section being elastically elongated responsive to the pivoting of said lever to controllably restrain said card into connection with said electrical connector.

11. An electronic assembly according to claim 10 wherein said guide member consists of a partially glass-filled polycarbonate material.

* * * * *